United States Patent
Zhang et al.

[11] Patent Number: 5,949,256
[45] Date of Patent: Sep. 7, 1999

[54] ASYMMETRIC SENSE AMPLIFIER FOR SINGLE-ENDED MEMORY ARRAYS

[75] Inventors: Kevin Zhang, Portland, Oreg.; Jenny R. Carman, Ft. Collins, Colo.

[73] Assignee: Hewlett Packard Company, Palo Alto, Calif.

[21] Appl. No.: 08/961,844

[22] Filed: Oct. 31, 1997

[51] Int. Cl.[6] .................................................. G11C 7/06
[52] U.S. Cl. .............................. 327/57; 327/55; 327/56
[58] Field of Search .............................. 327/51–57, 77, 327/81, 88, 89

[56] References Cited

U.S. PATENT DOCUMENTS

| | | | |
|---|---|---|---|
| 4,572,977 | 2/1986 | Takemae et al. | 327/57 |
| 4,763,026 | 8/1988 | Tsen et al. | 307/530 |
| 4,991,141 | 2/1991 | Tran | 365/207 |
| 5,043,599 | 8/1991 | Zitta | 307/355 |
| 5,296,753 | 3/1994 | Nakadai | 327/77 |
| 5,552,728 | 9/1996 | Lin | 327/57 |
| 5,729,159 | 3/1998 | Gersbach | 327/52 |

*Primary Examiner*—Toan Tran
*Attorney, Agent, or Firm*—Kevin M. Hart

[57] ABSTRACT

An asymmetric sense amplifier is disclosed for use with single-ended memory arrays. The sense amplifier has a bit input, a reference input, an enable input, and bistable output circuitry. The reference input may simply be tied to $V_{DD}$. The bistable output circuitry includes first and second output nodes disposed between first and second pull-up/pull-down paths, respectively. The first pull-up and pull-down paths may include first pull-up and pull-down FET channels, respectively. The second pull-up and pull-down paths may include second pull-up and pull-down FET channels, respectively. The bistable output circuitry is operable to be stable in first and second states. In both states, the output nodes are at opposite potentials. The sense amplifier is asymmetrical in the following sense: Either the second pull-down FET channel is wider than the first pull-down FET channel, or the first pull-up FET channel is wider than the second pull-up FET channel, or both. The result of the asymmetry is that the bistable output circuitry has a bias toward stabilizing in its first state. When the voltage on the bit input is equal to the voltage on the reference input and the enable input is asserted, the bistable output circuitry stabilizes in its first state; but when the voltage on the bit input is less than the voltage on the reference input by more than a threshold amount and the enable input is asserted, the bias is overcome and the bistable output circuitry stabilizes in its second state.

20 Claims, 1 Drawing Sheet

5,949,256

ASYMMETRIC SENSE AMPLIFIER FOR SINGLE-ENDED MEMORY ARRAYS

FIELD OF THE INVENTION

This invention relates generally to sense amplifier circuits, and more particularly to sense amplifier circuits for use in single-ended semiconductor memory arrays.

BACKGROUND

Sense amplifiers have been widely used in the design of memory arrays in order to improve the speed of read operations. Conventionally, the memory cells in a memory array each have complementary outputs to indicate a positive and an inverted version of the one-bit value stored therein. Prior to each read operation, two bit lines are precharged high. Then, when a particular memory cell is selected by the address decoding circuitry of the memory array, the selected cell's complementary outputs are connected to the two precharged bit lines. Depending on the value stored in the selected cell, one or the other of the two bit lines will fall to ground. A sense amplifier having complementary outputs is used to detect the differential voltage that begins to develop between the two bit lines as one of them starts falling to ground. As soon as a sufficient voltage differential develops between the bit lines to trigger the sense amplifier, the contents of the selected memory cell will be reflected by the polarity of the sense amplifier outputs. The result is a dramatic improvement in the time required to perform read operations, because the sense amplifier need not wait until one of the bit lines falls all the way to ground before the contents of the memory cell are reliably indicated.

Unfortunately, such a scheme requires that two bit lines be routed across the memory array to the sense amplifiers for each access port. For this reason, a single-ended scheme that uses only a single bit line from the selected memory cells has become an attractive alternative design technique. When the single-ended scheme is used, the number of required bit lines in the memory array is reduced, as is the number of metal tracks that must be formed to implement the memory array. Often, this also reduces the area required to implement the memory array. In the single-ended scheme, the sense amplifier must compare the single bit line with a reference voltage. If the voltage on the bit line is lower than the reference voltage, the sense amplifier will indicate one value. If the voltage on the bit line is higher than the reference voltage, the sense amplifier will indicate an opposite value. Consequently, sense amplifiers have been designed that use sophisticated circuitry for creating and maintaining a reference voltage higher than ground but lower than $V_{DD}$ in an attempt to optimize performance in single-ended schemes. However, such sense amplifier circuits are complex and often result in reduced sensing margin.

A need therefore exists for a simple sense amplifier circuit, suitable for use in single-ended memory schemes, that does not require sophisticated circuitry for creating and maintaining a reference voltage.

SUMMARY OF THE INVENTION

In one aspect, the invention includes a sense amplifier having a bit input, a reference input, an enable input, and bistable output circuitry. The bistable output circuitry is responsive to the bit input, the reference input and the enable input, and includes first and second output nodes. The first output node is disposed between a first pull-up path and a first pull-down path. The second output node is disposed between a second pull-up path and a second pull-down path. The first pull-up and pull-down paths may include first pull-up and pull-down field effect transistor ("FET") channels, respectively. And the second pull-up and pull-down paths may include second pull-up and pull-down FET channels, respectively. The bistable output circuitry is operable to be stable in first and second states. In the first state, the first output node is at a high voltage and the second output node is at a low voltage. In the second state, the first output node is at a low voltage and the second output node is at a high voltage. The sense amplifier is asymmetrical in the following sense: Either the second pull-down FET channel is wider than the first pull-down FET channel, or the first pull-up FET channel is wider than the second pull-up FET channel, or both. The result of the asymmetry is that the bistable output circuitry has a bias toward stabilizing in its first state. Preferably, the bias is of sufficient degree to accomplish the following functionality: When the voltage on the bit input is equal to the voltage on the reference input when the enable input is asserted, the bistable output circuitry stabilizes in its first state; but when the voltage on the bit input is less than the voltage on the reference input by more than a threshold amount when the enable input is asserted, the bias is overcome and the bistable output circuitry stabilizes in its second state.

A sense amplifier circuit built according to the invention has the particular advantage that the reference input may simply be connected to $V_{DD}$, rather than to a complex circuit designed to provide a stable reference voltage higher than ground but less than $V_{DD}$.

The bistable output circuitry may include first and second cross-coupled CMOS inverters. In such an embodiment, the first pull-up path may include a first p-channel FET, the first pull-down path may include a first n-channel FET, the second pull-up path may include a second p-channel FET, and the second pull-down path may include a second n-channel FET. The gate of the first p-channel FET is connected to the gate of the first n-channel FET and to the second output node. The gate of the second p-channel FET is connected to the gate of the second n-channel FET and to the first output node.

In an embodiment, the circuit may include a bit input FET and a reference input FET. In such an embodiment, the bit input is connected to the first output node via the channel of the bit input FET, and the reference input is connected to the second output node via the channel of the reference input FET.

In another embodiment, the reference input may be connected to the gate of a FET whose channel is part of the first pull-down path, and the bit input may be connected to the gate of a FET whose channel is part of the second pull-down path.

BRIEF DESCRIPTION OF THE DRAWINGS

The present invention is described in detail herein with reference to the accompanying drawings, wherein like reference numbers indicate functionally similar elements.

DETAILED DESCRIPTION OF THE PREFERRED EMBODIMENTS

Figure 1:
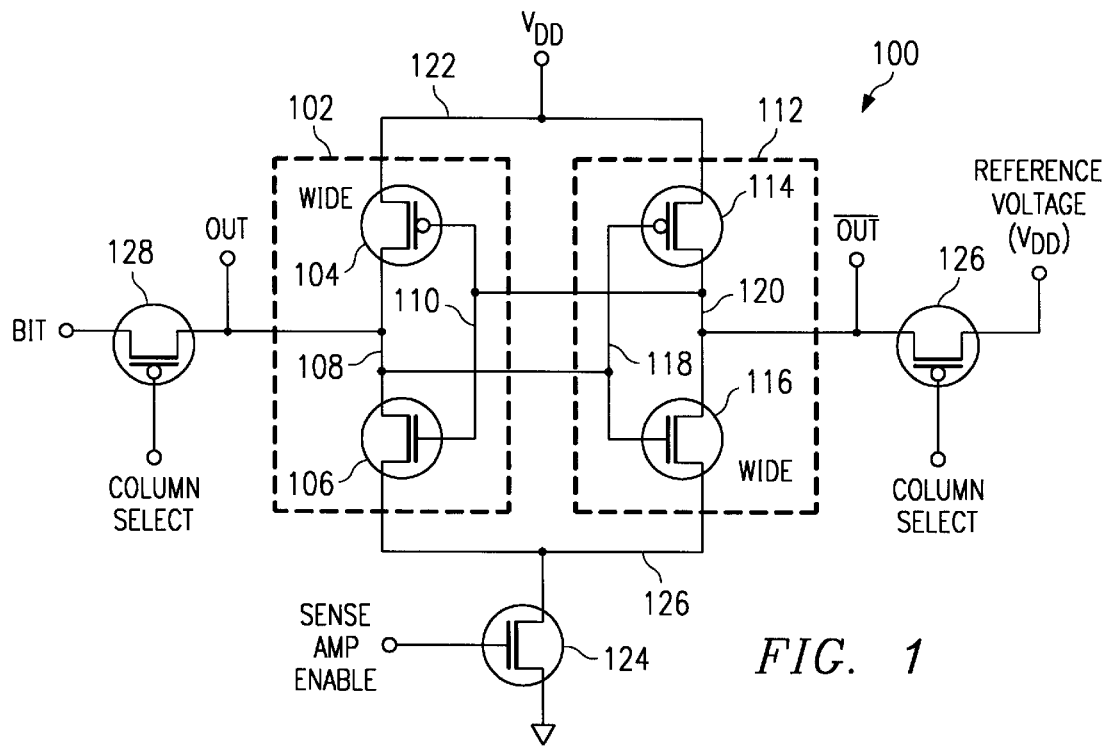
FIG. 1 is a schematic diagram illustrating an asymmetric sense amplifier circuit according to a preferred embodiment of the invention.

The sense amplifier circuit 100 of FIG. 1 includes two cross-coupled CMOS inverter circuits 102, 112. Inverter circuit 102 includes p-channel FET 104 and n-channel FET 106. The drain of FET 104 is connected to the drain of FET 106 at node 108, and the gates of FETs 104, 106 are connected together at node 110. Likewise, inverter circuit 112 includes p-channel FET 114 and n-channel FET 116. The drain of FET 114 is connected to the drain of FET 116 at node 120, and the gates of FETs 114, 116 are connected together at node 118. The cross-coupling of inverter circuits 102, 112 is accomplished by connecting node 110 (the input of inverter circuit 102) to node 120 (the output of inverter circuit 112), and by connecting node 118 (the input of inverter circuit 112) to node 108 (the output of inverter circuit 102). Together, inverter circuits 102, 112 form a bistable output circuit for sense amplifier 100.

FETs 106 and 124 act as a pull-down path for node 108. FETs 116 and 124 act as a pull-down path for node 120. FET 104 acts as a pull-up path for node 108, and FET 114 acts as a pull-up path for node 120. In the embodiment shown, the channel lengths of FETs 104, 106, 114 and 116 are approximately equal. However, the channel width of FET 104 is larger than the channel width of FET 106, and the channel width of FET 116 is larger than the channel width of FET 114. For sense amplifier 100, it was found that the best fimctionality was obtained when the larger transistors were slightly wider, but not a great deal wider, than the smaller transistors. In a preferred embodiment, the ratios [channel width of FET 104]:[channel width of FET 106] and [channel width of FET 116]:[channel width of FET 114] were both approximately equal to 1.1:1. It is believed, however, that the optimal channel width ratios will likely vary depending upon the process used to create the integrated circuit containing the sense amplifier.

In the embodiment shown in FIG. 1, the channel widths of the FETs in the two pull-up paths are asymmetrical. In addition, the channel widths of the FETs in the two pull-down paths are asymmetrical. In other embodiments, the asymmetry may be designed into just the pull-up paths, or just the pull-down paths, with similar results. The asymmetry in channel widths causes the bistable output circuit to have a bias in favor of stabilizing with node 108 equal to $V_{DD}$ and with node 120 equal to ground, provided the voltage on nodes 108 and 120 is approximately equal when FET 124 is turned on. This is because the wider channel widths will cause a stronger pull-up on node 108 and a stronger pull-down on node 120. On the other hand, if the voltage on node 108 is less than the voltage on node 120 by more than a threshold amount when FET 124 is turned on, then the bias caused by the asymmetrical channel widths is overcome, and the bistable output circuit instead stabilizes with node 108 equal to ground and node 120 equal to $V_{DD}$.

As shown in the drawing, the sources of FETs 104, 114 are connected to $V_{DD}$ at node 122. The drains of FETs 106, 116 are connected to ground via FET 124, which has its gate connected to the SENSE AMP ENABLE signal. The complementary outputs of sense amplifier circuit 100 are provided as follows: OUT is taken from node 108 (the output of inverter circuit 102), and OUT is taken from node 120 (the output of inverter circuit 112). Node 108 is connected to the BIT input via FET 128, which has its gate connected to a COLUMN SELECT signal. Node 120 is connected to $V_{DD}$ via FET 126, which also has its gate connected to the COLUMN SELECT signal.

In operation, the bit line is precharged to $V_{DD}$ using appropriate precharging circuitry (not shown), and SENSE AMP ENABLE is unasserted while a memory cell is selected using appropriate decoding circuitry (also not shown). COLUMN SELECT is then brought low for a sampling period, and is brought high again at the end of the sampling period. When COLUMN SELECT is brought low, FETs 126 and 128 are turned on. This connects the bit line to node 108 and the reference voltage ($V_{DD}$) to node 120. If the selected memory cell contains a high voltage value, then node 108 will precharge to $V_{DD}$ during the sampling period. On the other hand, if the selected memory cell contains a "0," then node 108 will follow the voltage on the bit line during the sampling period as the bit line evaluates. Although the sampling period is typically shorter than the time that would be necessary for the bit line to evaluate completely to "0," by the end of the sampling period node 108 will have been precharged to a value somewhat lower than $V_{DD}$. Timing of the sampling period should be adjusted to ensure that the bit line will have time to drop far enough below $V_{DD}$ to overcome the bias of the bistable output circuit in the event the memory cell contains a "0." As can be readily appreciated, the amount of this threshold voltage will vary depending on the specific implementation of the circuit. After the sampling period, SENSE AMP ENABLE is asserted, turning on FET 124. At that time, the bistable output circuit will reach one of its two previously-described stable states depending on the initial state of nodes 108 and 120.

Figure 2:
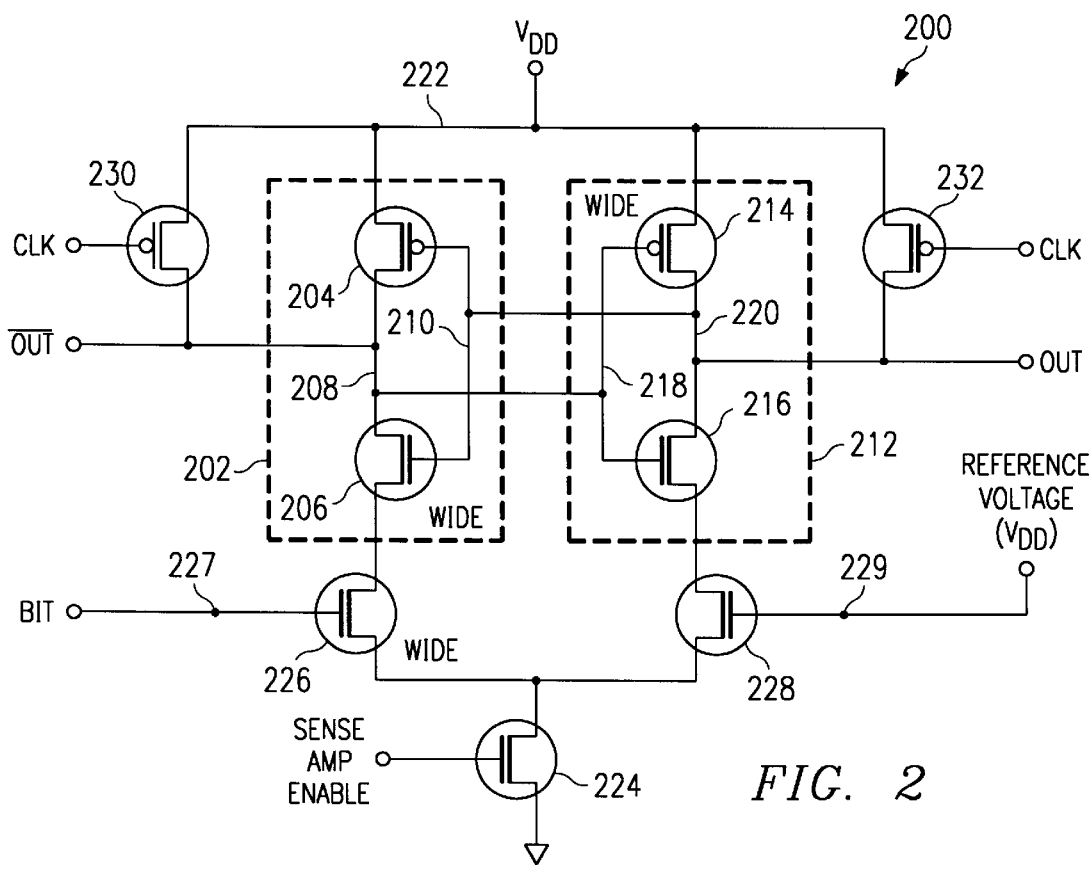
FIG. 2 is a schematic diagram illustrating an asymmetric sense amplifier circuit according to an alternative preferred embodiment of the invention.

FIG. 2 illustrates an alternative embodiment of the invention. Sense amplifier circuit 200 includes two cross-coupled CMOS inverter circuits 202, 212. Inverter circuit 202 includes p-channel FET 204 and n-channel FET 206. The drain of FET 204 is connected to the drain of FET 206 at node 208, and the gates of FETs 204, 206 are connected together at node 210. Likewise, inverter circuit 212 includes p-channel FET 214 and n-channel FET 216. The drain of FET 214 is connected to the drain of FET 216 at node 220, and the gates of FETs 214, 216 are connected together at node 218. The cross-coupling of inverter circuits 202, 212 is accomplished by connecting node 210 (the input of inverter circuit 202) to node 220 (the output of inverter circuit 212), and by connecting node 218 (the input of inverter circuit 212) to node 208 (the output of inverter circuit 202). Inverter circuits 202, 212, together with pull-down FETs 226 and 228, form a bistable output circuit for sense amplifier 200.

FETs 206, 226 and 224 act as a pull-down path for node 208. FETs 216, 228 and 224 act as a pull-down path for node 220. FET 204 acts as a pull-up path for node 208, and FET 214 acts as a pull-up path for node 220. In the embodiment shown, the channel lengths of FETs 204, 206, 226, 214, 216 and 228 are approximately equal. However, the channel widths of FETs 206, 214 and 226 are larger than the channel widths of FETs 204, 216 and 228. In a preferred embodiment of sense amplifier 200, the ratios of the channel widths of the larger transistors to the channel widths of the smaller transistors was approximately 3:1. Again, however, it is believed that the optimal channel width ratios will vary depending on the process used to create the integrated circuit containing the sense amplifier.

In the embodiment shown in FIG. 2, the channel widths of the FETs in the two pull-up paths are asymmetrical. In addition, the channel widths of the FETs in the two pull-down paths are asymmetrical. In other embodiments, the asymmetry may be designed into just the pull-up paths, or just the pull-down paths, with similar results. The asymmetry in channel widths causes the bistable output circuit to have a bias in favor of stabilizing with node 220 equal to $V_{DD}$ and with node 208 equal to ground, provided the voltage on nodes 208 and 220 is approximately equal when FET 224 is turned on, and provided the BIT input is equal to the reference voltage at that time. This is because, under the just-stated conditions, the wider channel widths will cause a stronger pull-up on node 220 and a stronger pull-down on node 208. On the other hand, if the voltage on the BIT input is less than the reference voltage by more than a threshold amount when FET 224 is turned on, then the bias caused by the asymmetrical channel widths is overcome, and the bistable output circuit instead stabilizes with node 220 equal to ground and node 208 equal to $V_{DD}$.

As shown in the drawing, the sources of FETs 204, 214 are connected to $V_{DD}$ at node 222. The sources of FETs 206, 216 are connected to ground via FETs 226 and 228, respectively, and FET 224. FET 224 has its gate connected to the SENSE AMP ENABLE signal. The complementary outputs of sense amplifier circuit 200 are provided as follows: OUT is taken from node 220 (the output of inverter circuit 212), and OUT is taken from node 208 (the output of inverter circuit 202). The gate of FET 226 is the BIT input, and the gate of FET 228 is the REFERENCE VOLTAGE input.

In operation, CLK is brought low momentarily before the sense amplifier is enabled. This turns on FETs 230 and 232 and precharges both of nodes 208 and 220 to $V_{DD}$. Then, a memory cell is selected (and its output connected to the bit line), and SENSE AMP ENABLE is brought high. If the selected memory cell contains a "1," then nodes 227 and 229 will be at equal potential. The result will be that the bistable output circuitry will reach a stable state in which node 208 is at a low voltage value and in which node 220 is at a high voltage value. This will occur because of the wider (and therefore stronger) pull-down path on node 208 and the wider (and therefore stronger) pull-up path on node 220. On the other hand, if the selected memory cell contains a "0," then node 227 will reach a lower potential than node 229 as the bit line evaluates. As soon as the potential difference between nodes 227 and 229 becomes large enough to overcome the bias caused by the asymmetrical channel widths, the bistable output circuitry will reach its other stable state in which node 208 is at a high voltage value and node 220 is at a low voltage value. The amount of the threshold voltage differential across nodes 227 and 229 necessary to read a "0" will vary, of course, depending upon the specific implementation of the circuit.

While the present invention has been described in detail in relation to various preferred embodiments thereof, it should be understood that the described embodiments have been presented by way of example only and not by way of limitation. It will be understood by those skilled in the art that various changes may be made in the form and details of the embodiments without departing from the spirit and scope of the invention as defined by the appended claims and their equivalents.

What is claimed is:

1. A sense amplifier for use with single-ended memory arrays and obviating the need for reference voltage generation circuitry, the sense amplifier comprising:

a first pull-up FET having its channel connected between a supply voltage and a first output node;

a first pull-down FET having its channel connected between the first output node and ground via the channel of an enable FET;

a second pull-up FET having its channel connected between the supply voltage and a second output node;

a second pull-down FET having its channel connected between the second output node and ground via the channel of the enable FET;

an input FET having its channel connected between a bit input and the first output node; and a reference FET having its channel connected between the supply voltage and the second output node;

wherein the second output node is connected to the gate of the first pull-up FET and to the gate of the first pull-down FET;

wherein the first output node is connected to the gate of the second pull-up FET and to the gate of the second pull-down FET;

wherein the gate of the input FET is connected to a select signal;

wherein the gate of the reference FET is connected to the select signal;

wherein the gate of the enable FET is connected to a sense amplifier enable signal; and wherein the channel lengths of the first and second pull-up FETs are substantially equal, but the channel widths of the first and second pull-up FETs are substantially different.

2. The sense amplifier of claim 1, wherein the channel width of the first pull-up FET is substantially larger than the channel width of the second pull-up FET.

3. The sense amplifier of claim 2, wherein the channel lengths of the first and second pull-down FETs are substantially equal, but the channel width of the second pull-down FET is substantially larger than the channel width of the first pull-down FET.

4. The sense amplifier of claim 1, wherein the channel width of the second pull-up FET is substantially larger than the channel width of the first pull-up FET.

5. The sense amplifier of claim 4, wherein the channel lengths of the first and second pull-down FETs are substantially equal, but the channel width of the first pull-down FET is substantially larger than the channel width of the second pull-down FET.

6. A sense amplifier for use with single-ended memory arrays and obviating the need for reference voltage generation circuitry, the sense amplifier comprising:

a first pull-up FET having its channel connected between a supply voltage and a first output node;

a first pull-down FET having its channel connected between the first output node and ground via the channel of an enable FET;

a second pull-up FET having its channel connected between the supply voltage and a second output node;

a second pull-down FET having its channel connected between the second output node and ground via the channel of the enable FET;

an input FET having its channel connected between a bit input and the first output node; and a reference FET having its channel connected between the supply voltage and the second output node;

wherein the second output node is connected to the gate of the first pull-up FET and to the gate of the first pull-down FET;

wherein the first output node is connected to the gate of the second pull-up FET and to the gate of the second pull-down FET;

wherein the gate of the input FET is connected to a select signal;

wherein the gate of the reference FET is connected to the select signal;

wherein the gate of the enable FET is connected to a sense amplifier enable signal; and wherein the channel lengths of the first and second pull-down FETs are substantially equal, but the channel widths of the first and second pull-down FETs are substantially different.

7. The sense amplifier of claim 6, wherein the channel width of the second pull-down FET is substantially larger than the channel width of the first pull-down FET.

8. The sense amplifier of claim 7, wherein the channel lengths of the first and second pull-up FETs are substantially equal, but the channel width of the first pull-up FET is substantially larger than the channel width of the second pull-up FET.

9. The sense amplifier of claim 6, wherein the channel width of the first pull-down FET is substantially larger than the channel width of the second pull-down FET.

10. The sense amplifier of claim 9, wherein the channel lengths of the first and second pull-up FETs are substantially equal, but the channel width of the second pull-up FET is substantially larger than the channel width of the first pull-up FET.

11. A sense amplifier for use with single-ended memory arrays and obviating the need for reference voltage generation circuitry, the sense amplifier comprising:
    a first pull-up FET having its channel connected between a supply voltage and a first output node;
    a first pull-down FET having its channel connected between the first output node and ground via the channel of an input FET and the channel of an enable FET, the channel of the first pull-down FET and the channel of the input FET forming a first pull-down path;
    a second pull-up FET having its channel connected between the supply voltage and a second output node;
    a second pull-down FET having its channel connected between the second output node and ground via the channel of a reference FET and the channel of the enable FET, the channel of the second pull-down FET and the channel of the reference FET forming a second pull-down path;
    a first precharge FET having its channel connected between the supply voltage and the first output node; and
    a second precharge FET having its channel connected between the supply voltage and the second output node;
    wherein the second output node is connected to the gate of the first pull-up FET and to the gate of the first pull-down FET;
    wherein the first output node is connected to the gate of the second pull-up FET and to the gate of the second pull-down FET;
    wherein the gate of the input FET is connected to a bit signal;
    wherein the gate of the reference FET is connected to the supply voltage;
    wherein the gate of the enable FET is connected to a sense amplifier enable signal;
    wherein the gates of the first and second precharge FETs are connected to a precharge signal; and
    wherein the channel lengths of the first and second pull-up FETs are substantially equal, but the channel widths of the first and second pull-up FETs are substantially different.

12. The sense amplifier of claim 11, wherein the channel width of the first pull-up FET is substantially larger than the channel width of the second pull-up FET.

13. The sense amplifier of claim 12, wherein the cumulative channel lengths of the first and second pull-down paths are substantially equal, but the cumulative channel width of the second pull-down path is substantially larger than the cumulative channel width of the first pull-down path.

14. The sense amplifier of claim 11, wherein the channel width of the second pull-up FET is substantially larger than the channel width of the first pull-up FET.

15. The sense amplifier of claim 14, wherein the cumulative channel lengths of the first and second pull-down paths are substantially equal, but the cumulative channel width of the first pull-down path is substantially larger than the cumulative channel width of the second pull-down path.

16. A sense amplifier for use with single-ended memory arrays and obviating the need for reference voltage generation circuitry, the sense amplifier comprising:
    a first pull-up FET having its channel connected between a supply voltage and a first output node;
    a first pull-down FET having its channel connected between the first output node and ground via the channel of an input FET and the channel of an enable FET, the channel of the first pull-down FET and the channel of the input FET forming a first pull-down path;
    a second pull-up FET having its channel connected between the supply voltage and a second output node;
    a second pull-down FET having its channel connected between the second output node and ground via the channel of a reference FET and the channel of the enable FET, the channel of the second pull-down FET and the channel of the reference FET forming a second pull-down path;
    a first precharge FET having its channel connected between the supply voltage and the first output node; and
    a second precharge FET having its channel connected between the supply voltage and the second output node;
    wherein the second output node is connected to the gate of the first pull-up FET and to the gate of the first pull-down FET;
    wherein the first output node is connected to the gate of the second pull-up FET and to the gate of the second pull-down FET;
    wherein the gate of the input FET is connected to a bit signal;
    wherein the gate of the reference FET is connected to the supply voltage;
    wherein the gate of the enable FET is connected to a sense amplifier enable signal;
    wherein the gates of the first and second precharge FETs are connected to a precharge signal; and
    wherein the cumulative channel lengths of the first and second pull-down paths are substantially equal, but the cumulative channel widths of the first and second pull-down paths are substantially different.

17. The sense amplifier of claim 16, wherein the cumulative channel width of the first pull-down path is substantially larger than the cumulative channel width of the second pull-down path.

18. The sense amplifier of claim 17, wherein the channel lengths of the first and second pull-up FETs are substantially equal, but the channel width of the second pull-up FET is substantially larger than the channel width of the first pull-up FET.

19. The sense amplifier of claim 16, wherein the cumulative channel width of the second pull-down path is substantially larger than the cumulative channel width of the first pull-down path.

20. The sense amplifier of claim 19, wherein the channel lengths of the first and second pull-up FETs are substantially equal, but the channel width of the first pull-up FET is substantially larger than the channel width of the second pull-up FET.

* * * * *